(12) United States Patent
Anderson et al.

(10) Patent No.: US 7,799,609 B2
(45) Date of Patent: Sep. 21, 2010

(54) METHOD OF MANUFACTURING DUAL ORIENTATION WAFERS

(75) Inventors: Brent A. Anderson, Jericho, VT (US); John J. Ellis-Monaghan, Grand Isle, VT (US); Alain Loiseau, Williston, VT (US); Kirk D. Peterson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 331 days.

(21) Appl. No.: 11/955,436

(22) Filed: Dec. 13, 2007

(65) Prior Publication Data

US 2008/0096370 A1    Apr. 24, 2008

Related U.S. Application Data

(63) Continuation of application No. 11/160,365, filed on Jun. 21, 2005, now Pat. No. 7,344,962.

(51) Int. Cl.
*H01L 21/00* (2006.01)
*H01L 29/04* (2006.01)

(52) U.S. Cl. ............... 438/109; 438/106; 438/108; 257/74

(58) Field of Classification Search .......... 438/106, 438/108, 109; 257/74
See application file for complete search history.

(56) References Cited

U.S. PATENT DOCUMENTS

| | | | |
|---|---|---|---|
| 4,939,568 A * | 7/1990 | Kato et al. ............ | 257/686 |
| 6,022,766 A * | 2/2000 | Chen et al. ........... | 438/152 |
| 6,743,292 B2 | 6/2004 | Jia et al. | |
| 6,749,686 B2 | 6/2004 | Ami et al. | |
| 6,815,278 B1 | 11/2004 | Ieong et al. | |
| 6,830,962 B1 | 12/2004 | Guarini et al. | |
| 7,253,034 B2 | 8/2007 | Chan et al. | |
| 2004/0048446 A1 * | 3/2004 | Gonzalez ............. | 438/455 |
| 2005/0116290 A1 | 6/2005 | de Souza et al. | |
| 2005/0277235 A1 * | 12/2005 | Son et al. ............. | 438/166 |
| 2005/0277260 A1 | 12/2005 | Cohen et al. | |

* cited by examiner

*Primary Examiner*—Matthew C Landau
*Assistant Examiner*—James M Mitchell
(74) *Attorney, Agent, or Firm*—Gibb I.P. Law Firm, LLC

(57) ABSTRACT

Disclosed is a method of manufacturing dual orientation wafers. A trench is formed in a multi-layer wafer to a silicon substrate with a first crystalline orientation. The trench is filled with a silicon material (e.g., amorphous silicon or polysilicon trench). Isolation structures are formed to isolate the silicon material in the trench from a semiconductor layer with a second crystalline orientation. Additional isolation structures are formed within the silicon material in the trench and within the semiconductor layer. A patterned amorphization process is performed on the silicon material in the trench and followed by a recrystallization anneal such that the silicon material in the trench recrystallizes with the same crystalline orientation as the silicon substrate. The resulting structure is a semiconductor wafer with isolated semiconductor areas on the same plane having different crystalline orientations as well as isolated sections within each semiconductor area for device formation.

17 Claims, 11 Drawing Sheets

METHOD OF MANUFACTURING DUAL ORIENTATION WAFERS

CROSS-REFERENCE TO RELATED APPLICATIONS

This application is a continuation of U.S. application Ser. No. 11/160,365 filed Jun. 21, 2005, the complete disclosure of which, in its entirety, is herein incorporated by reference.

BACKGROUND OF THE INVENTION

1. Field of the Invention

N/A

2. Description of the Related Art

Different complimentary metal oxide semiconductor (CMOS) devices, such as n-channel metal oxide semiconductor field effect transistors (n-FETs) or p-channel metal oxide semiconductor field effect transistors (p-FETs), often have optimal mobility with semiconductor materials having different crystalline orientations. For example, p-FETs have optimal mobility with 110 orientation silicon because of its excellent hole mobility. Meanwhile, n-FETs have optimal mobility with 100 orientation because of its excellent electron mobility. As complimentary metal oxide semiconductor (CMOS) technology advances, using semiconductor wafers having semiconductor materials with different crystalline orientations optimal for different CMOS devices (i.e., dual orientation wafers) is imperative for allowing different CMOS devices to be formed on the same substrate at the same level. U.S. Pat. No. 6,815,278, to Ieong et al., on Nov. 9, 2004 (incorporated herein by reference), discloses such a dual orientation wafer and commonly used technique for forming such wafers which incorporates a selective epitaxial growth method. The present invention provides a method for forming such dual orientation wafers that is less costly and more easily integrated into current semiconductor wafer manufacturing processes.

SUMMARY OF THE INVENTION

This disclosure presents a method of manufacturing a dual orientation wafer with isolated semiconductor areas with different crystalline orientations and with isolated sections within each semiconductor area to form different devices. The method generally starts with a multi-layer stack formed of a silicon substrate, an insulating layer, a semiconductor layer, a thin oxide layer, and a nitride layer. The semiconductor layer is preferably a silicon material; however, it may be another semiconductor material such as gallium arsenide (GaAs). The silicon substrate has a first crystalline orientation that is different from the second crystalline orientation of the semiconductor layer. For example, the semiconductor layer and the silicon substrate may each have any one of the silicon crystalline orientations (e.g., 100, 111, 110, 211, 311, 511 and 711) as long as they are not the same.

More specifically, in one embodiment of the method, a trench is formed in the multi-layer stack. The trench is etched through the nitride layer, the thin oxide layer, the semiconductor layer with the second crystalline orientation and the insulating layer to expose the silicon substrate with the first crystalline orientation. An essentially conformal silicon material (e.g., amorphous silicon or poly-crystalline silicon) is deposited over the nitride layer and into the trench. The thickness of this silicon material is such that a top surface of the deposited silicon material within the trench is approximately co-planar with a top surface of the semiconductor layer. A second thin oxide layer may then be grown or deposited on a top surface of the deposited silicon material.

To form the isolation structures, an essentially conformal second nitride layer can be deposited over the silicon material such that a portion of the second nitride layer is approximately level with the first nitride layer in the recessed areas. Excess material can be removed from above the first nitride layer such that the portion of the second nitride layer in the trench that is level with the first nitride layer remains. Recesses can then be patterned and etched through the silicon material adjacent the sidewalls of the trench. Additional recesses can also be simultaneously patterned and etched through the silicon material within the trench and through the semiconductor layer outside the trench. All of the recesses can be filled with an oxide to complete the isolation structures described above. Once the isolation structures are complete, the first nitride layer and any oxide material above the first nitride layer are then removed.

A mask is then formed and patterned to expose the deposited silicon material and protect the semiconductor layer. Once the mask is formed, the silicon material is completely amorphized down to the substrate region. Amorphizing the silicon material can be accomplished by implanting the silicon material. The implanted species should be one that is capable of amorphizing the crystals in the silicon material. The species should be able to be incorporated into the silicon as the silicon is recrystallized (e.g., silicon and germanium). Once the silicon material is amorphized, it is heated to a recrystallization temperature so that it recrystallizes with the first crystalline orientation of the silicon substrate. The semiconductor layer remains in the second crystalline orientation throughout the amorphization and recrystallization processes. The resulting structure is a wafer having a first semiconductor area (with the first crystalline orientation) co-planar with and isolated from a second semiconductor area (with a second crystalline orientation). Additional isolation structures separate sections within each semiconductor area to be used for different semiconductor devices. The wafer may optionally be polished at this point to smooth and planarize the silicon in the 2 regions.

In another embodiment of the method a first trench and at least one other trench are formed in the multi-layer stack as described above. The first trench is larger than the other trench and will define the boundary between the first semiconductor area (with the first crystalline orientation) and the second semiconductor area (with the second crystalline orientation). The other trenches will form isolation structures that separate sections within the second semiconductor area to be used for different semiconductor devices. The first trench and the other trenches are patterned and etched through the nitride layer, the thin oxide layer, the semiconductor layer. The first trench and the other trenches are filled with an oxide which is polished level with the nitride layer. Then, one or more second trenches are etched through the oxide within the first trench down to the silicon substrate. The second trenches are formed such that the sidewalls of the first trench remain lined with the oxide and, thereby, form the isolation structures that will separate the first and second semiconductor areas. Additionally, remaining oxide between the second trenches forms the isolation structures that will separate sections within the first semiconductor area to be used for different devices. Once formed, the second trenches are filled with a silicon material (e.g., an amorphous silicon or poly-crystalline silicon). Any excess silicon material is removed from above the nitride and oxide regions.

A mask is then formed and patterned to expose the silicon material and to protect the semiconductor layer. The deposited silicon is then amorphized. After amorphizing the silicon material, the upper portion of the silicon material is thermally oxidized and the silicon material is recrystallized. Note that if the temperature of the thermal oxidation is above the recrystallization temperature, a separate recrystallization anneal process is not required because the upper portion of the silicon material will be oxidized as a lower portion of the silicon material in contact with the silicon substrate is recrystallized. Once the silicon material is recrystallized, the remaining nitride layer of the multi-layer stack is stripped and the top surface of the wafer is polished. As with the previously described embodiment, the resulting structure is a wafer having a first semiconductor area (with the first crystalline orientation) co-planar with and isolated from a second semiconductor area (with a second crystalline orientation). Additional isolation structures also separate sections within each semiconductor area to be used for different semiconductor devices.

Therefore, the invention provides for a method of manufacturing dual orientation wafers by using a patterned amorphization process followed by a recrystallization anneal to form semiconductor areas with different crystalline orientations on the same plane of a wafer. This method is faster, more cost effective and more easily integrated into current semiconductor wafer manufacturing processes than prior art methods. These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
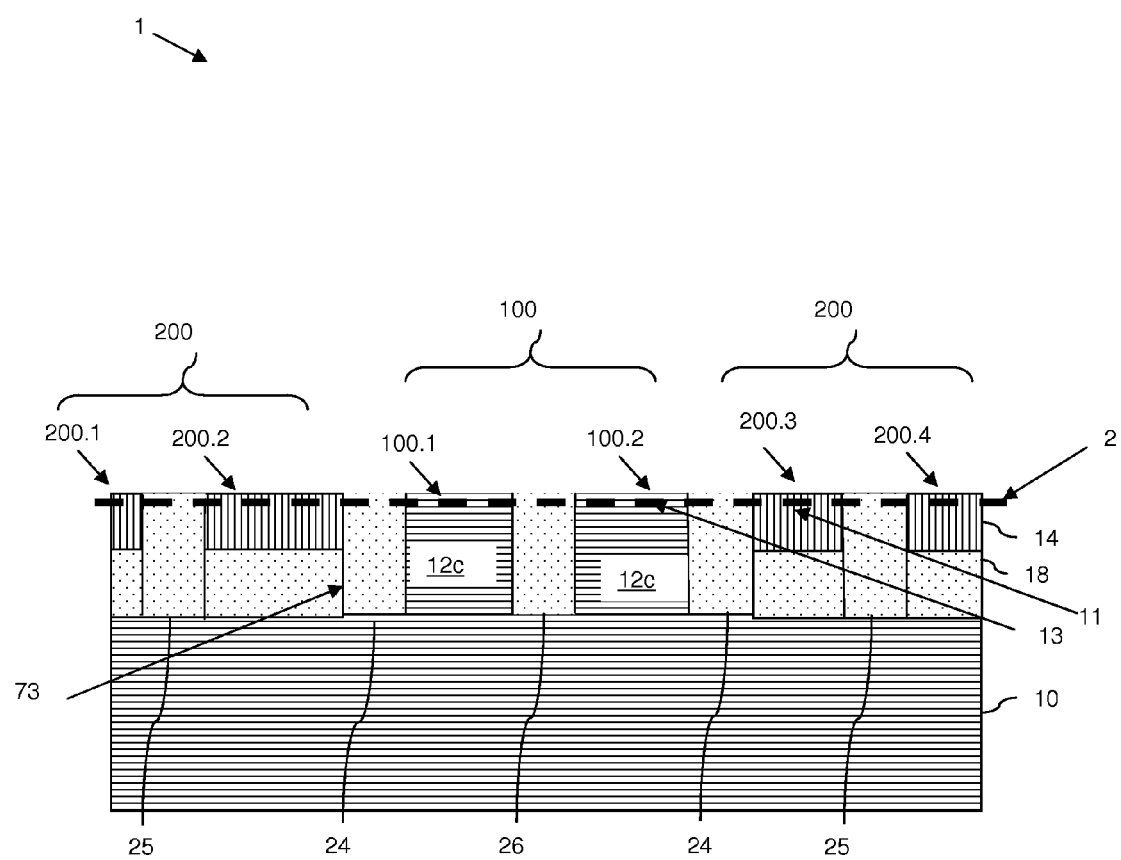
FIG. 1 is a schematic diagram of a dual orientation semiconductor wafer formed according to the method embodiments of the invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As discussed above, as CMOS technology advances, using dual orientation semiconductor wafers is imperative for allowing different CMOS devices to be formed on the same substrate at the same level. FIG. 1 illustrates a dual orientation semiconductor structure 1. The semiconductor structure 1 comprises at least two different areas of semiconductor material (e.g., 100, 200) on the same plane 2. A first semiconductor area 100 has a first crystalline orientation and a second semiconductor area 200 has a second crystalline orientation. The semiconductor areas 100, 200 each have corresponding top surfaces 13, 11, respectively, that are approximately level (i.e., semiconductor areas 100, 200 are co-planar 2). The semiconductor areas 100, 200 are isolated from each other by isolation structures 24. The semiconductor areas 100, 200 are separated into sections (e.g., 100.1-100.2 and 200.1-200.4) by additional isolation structures 26, 25, respectively, which define sections in which different semiconductor devices (e.g., n-FETs and p-FETs) can be formed within the areas 100, 200. The silicon substrate 10 is in contact with and has the same crystalline orientation semiconductor area 100. The silicon substrate 10 is isolated from the semiconductor area 200 by an insulating layer 18.

Figure 2:
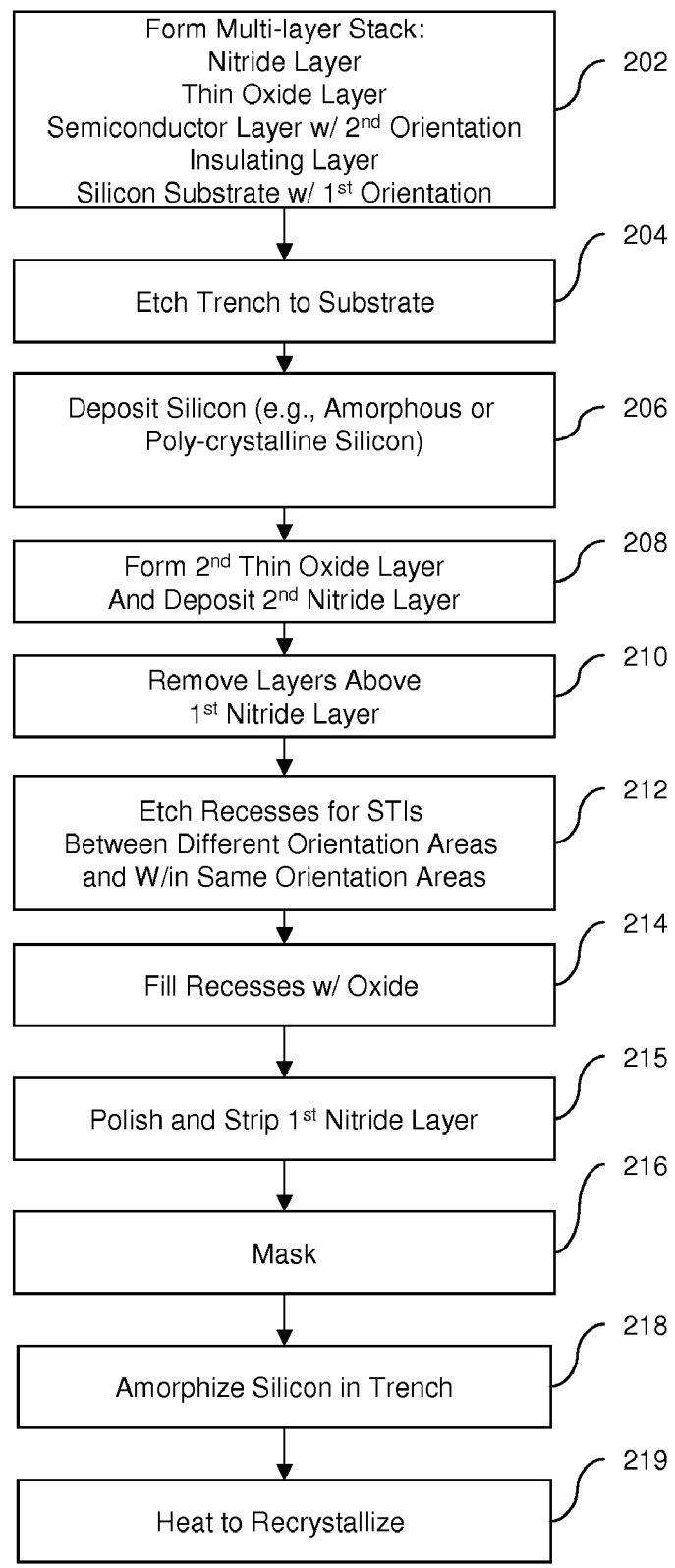
FIG. 2 is a flow diagram illustrating an embodiment of the method of the invention.
Figure 3:
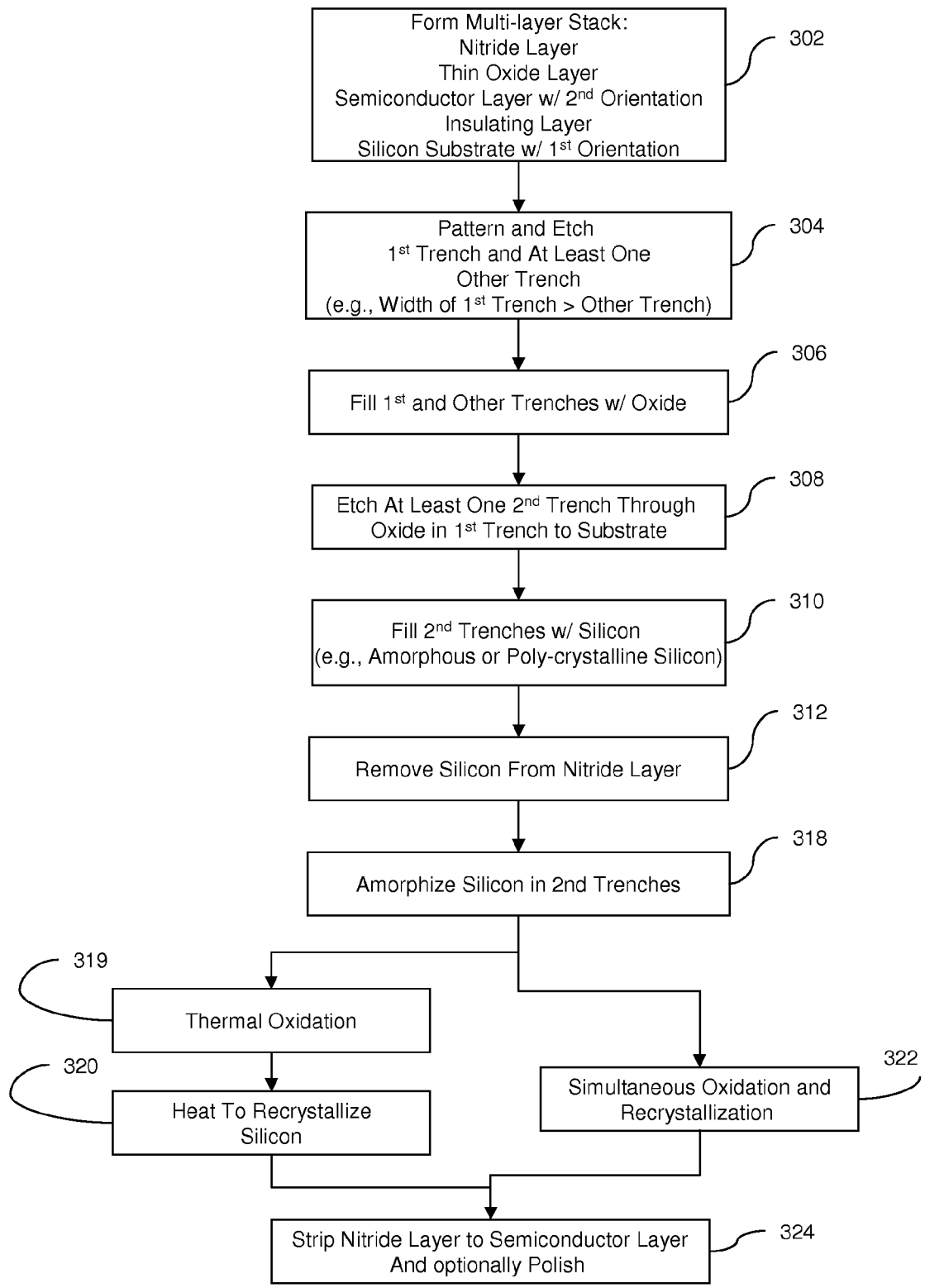
FIG. 3 is a flow diagram illustrating another embodiment of the method of the invention.
Figure 4:
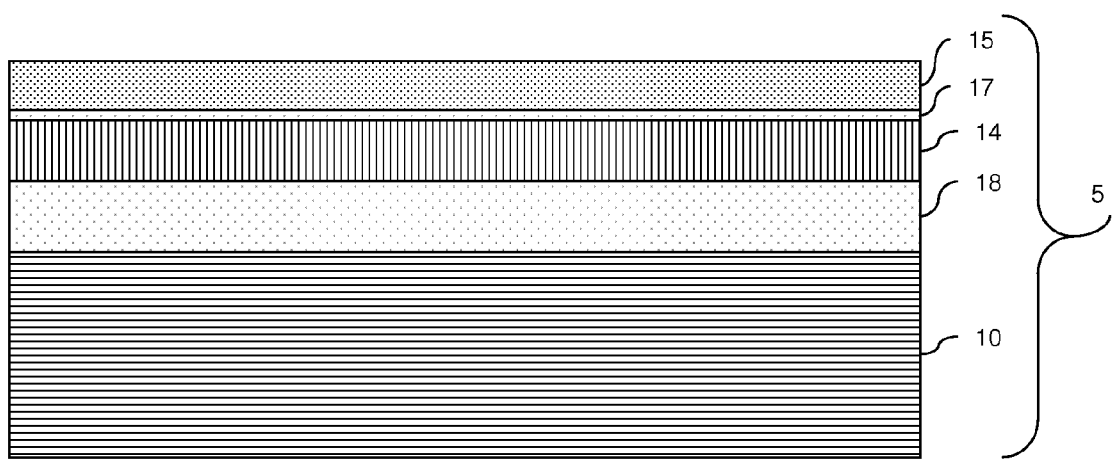
FIGS. 4-13 are partially completed dual orientation semiconductor wafers formed according to an embodiment of the method of the present invention; and, FIGS. 14-19 are partially completed dual orientation semiconductor wafers formed according to another embodiment of the method of the present invention.

FIGS. 2 and 3 are schematic flow diagrams illustrating two embodiments of a method of manufacturing the dual orientation wafer 1 of FIG. 1. Each embodiment of the method starts with a multi-layer stack 5 (i.e., wafer) formed of a silicon substrate 10, an insulating layer 18, a semiconductor layer 14, and a nitride layer 15 (202, 302; see FIG. 4). The stack 5 may include additional layers, for example, an additional insulating layer 17 (e.g., a thin oxide layer such as silicon dioxide ($SiO_2$)) between the nitride layer 15 and the semiconductor layer 14. The semiconductor layer 14 preferably comprises a silicon layer; however, it may also comprise another semiconductor layer such as a gallium arsenide (GaAs) layer. The silicon substrate 10 should have a first crystalline orientation (e.g., 110 silicon) different from the second crystalline orientation of the semiconductor layer 14 (e.g., 100 silicon). For example, the semiconductor layer 14 and the silicon substrate 10 may each have any one of the silicon crystalline orientations (e.g., 100, 111, 110, 211, 311, 511 and 711) as long as they are not the same orientation.

Figure 5:
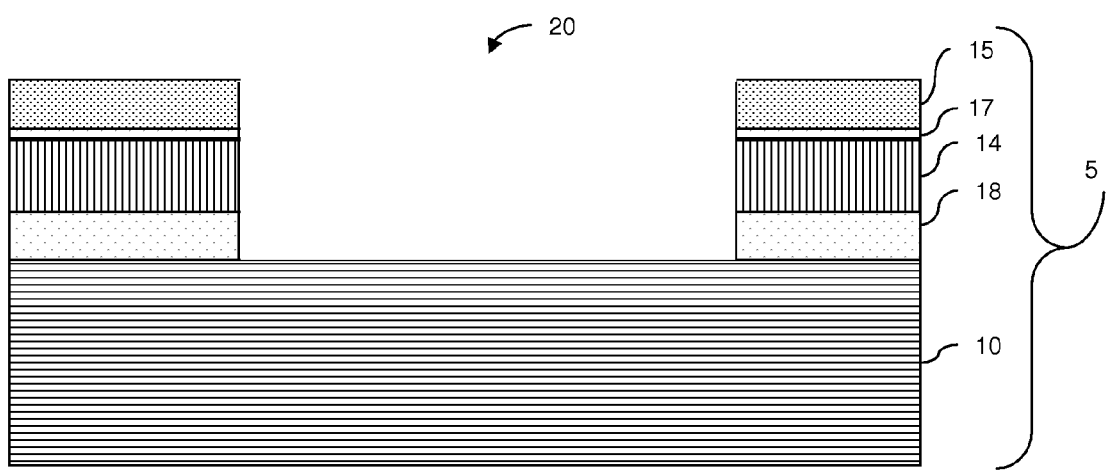
Figure 6:
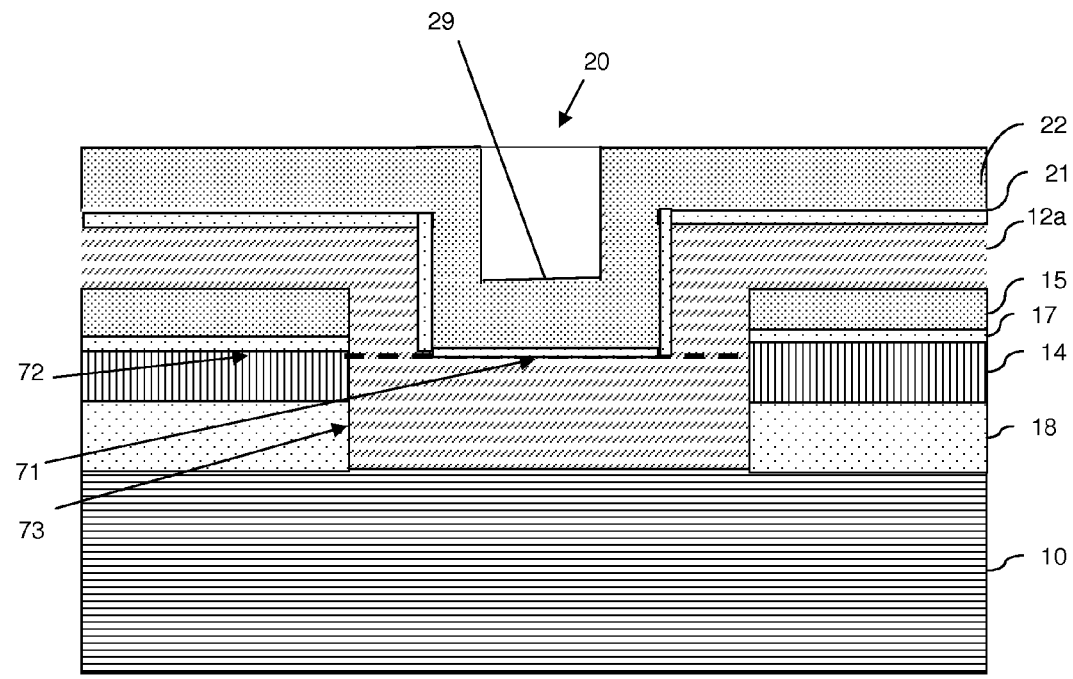
Figure 7:
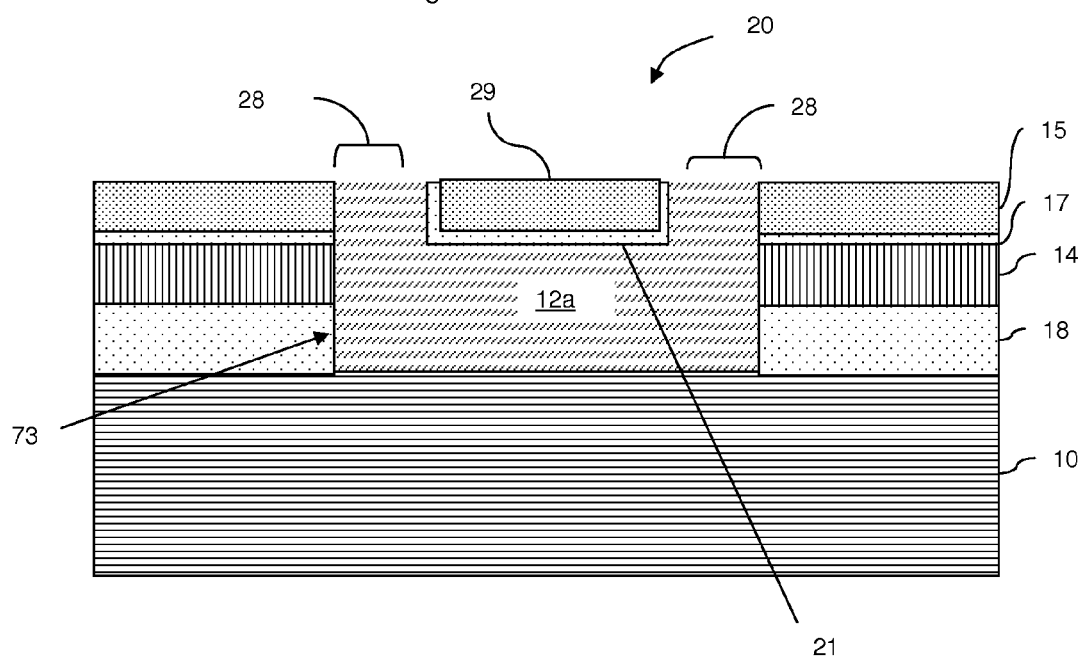
Figure 8:
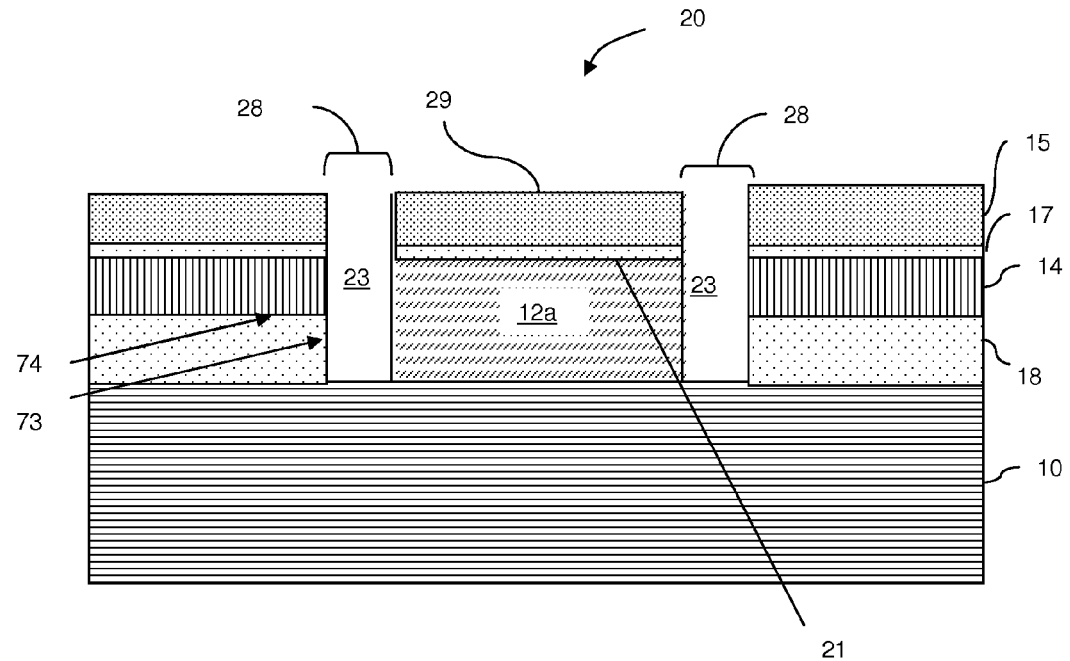
Figure 9:
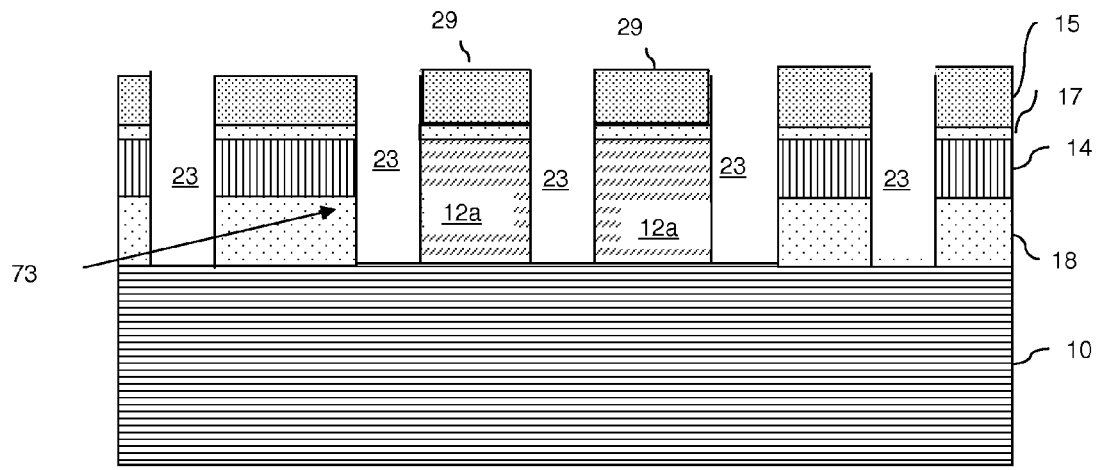
Figure 10:
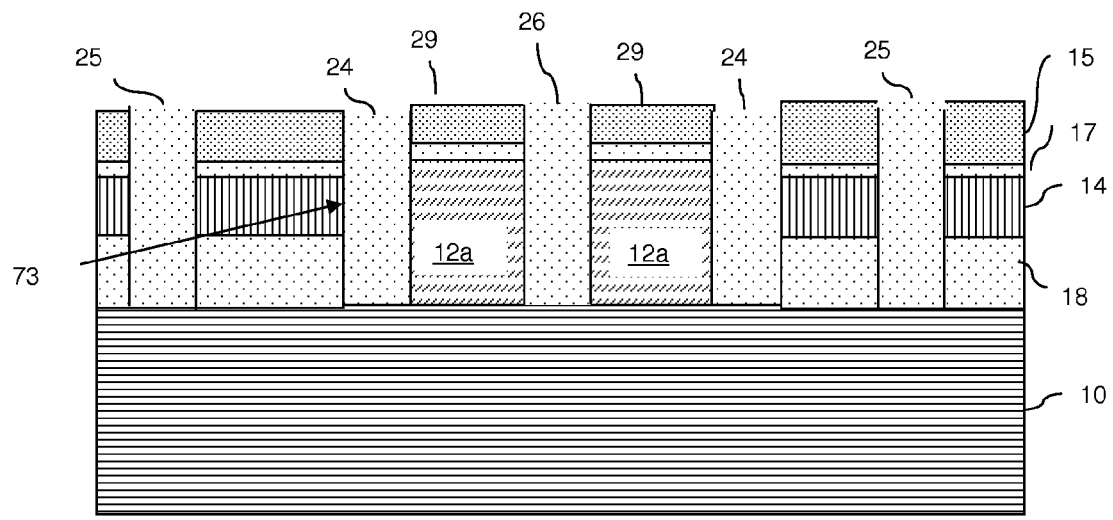
Figure 11:
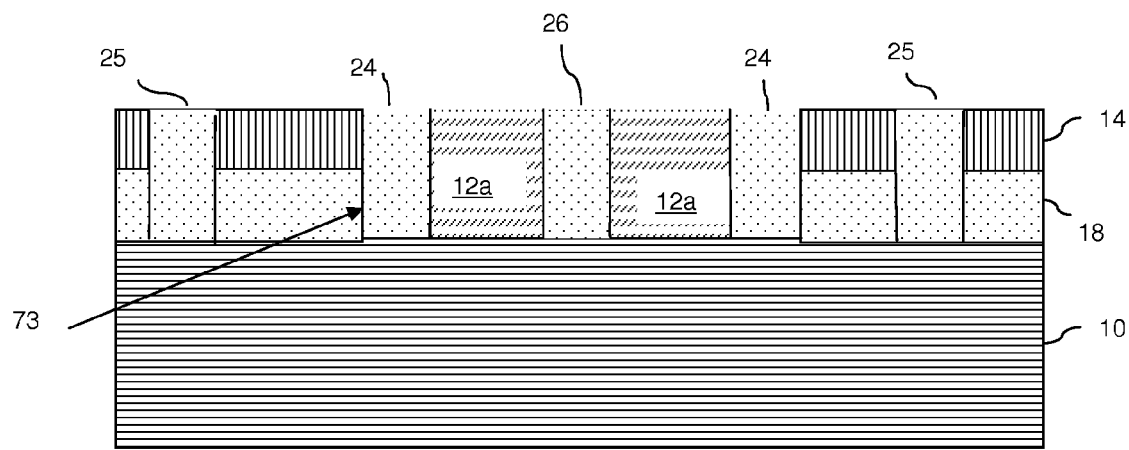

Referring to FIG. 2 in one embodiment of the method a trench 20 is formed in the multi-layer stack 5 (204, see FIG. 5). The trench 20 is etched through the nitride layer 15, the semiconductor layer 14, the thin oxide layer 17, and the insulating layer 18 to expose the silicon substrate 10. Lithographic patterning and selective etching processes may be used to form the trench 20. An essentially conformal layer of silicon material 12a (e.g., amorphous silicon or polysilicon) is deposited over the nitride layer 15 and fills the trench 20 (206, see FIG. 6). The thickness of the silicon material 12a is such that a centered top surface 71 of the deposited silicon material 12a in the trench 20 is approximately co-planar with the top surface 72 of the semiconductor layer 14. Note that optionally, a protective second thin oxide layer 21 is formed on top of the deposited silicon material 12 (208, see FIG. 6). Then, an essentially conformal second nitride layer 22 (e.g., silicon nitride ($Si_3N_4$)) is deposited over the second thin oxide layer 21 on the silicon material 12 such that a portion 29 of the second nitride layer 22 is positioned in the trench 20 and is approximately level with the first nitride layer (208, see FIG. 6). Excess material is removed from the first nitride layer 15 such that the portion 29 of the second nitride layer 22 over the silicon material 12 in the trench 20 remains and with gaps 28 (i.e., silicon-filled gaps) between the first nitride layer 15 and the remaining portion 29 of the second nitride layer 22 (210, see FIG. 8). Then, recesses 23 are lithographically patterned and etched (212, see FIGS. 8 and 9). The recesses 23 patterned so that they may be used to form isolations structures 24 that are formed adjacent the sidewalls 73 of the trench 20 in order to separate the two areas 100, 200. Recesses 23 are also patterned so that they may be used to form additional isolation structures 26, 25 within the silicon of the trench and within the semiconductor layer outside the trench that will define sections within each semiconductor area 100, 200 in which different semiconductor devices (e.g., n-FETs and p-FETs) can be formed. The isolation structures 24 and additional isolation structures 25 and 26 are completed in a manner consistent with shallow trench isolation technology. Specifically, after the recesses 23 are formed by a directional etch process such as reactive ion etching process, (212, see FIGS. 8 and 9), the recesses 23 are cleaned, filled with an oxide (e.g., $SiO_2$) (214, see FIG. 10), and the wafer is polished (e.g., by chemical-mechanical polishing) (215). The recesses 23 should preferably be etched to the silicon substrate 10; however, the recesses 23 must at least be etched to below the level of the top surface 74 of the insulating layer 18. The first nitride layer 15 and any oxide above the nitride layer 15 are then removed (215, see FIG. 11). The nitride layer 15 may be stripped by a hot phosphoric acid etch that removes the nitride layer 15 but does not damage the underlying second thin oxide layer 21 that protects the silicon material 12 and the first thin oxide layer 17 that protects the semiconductor layer 14.

Figure 12:
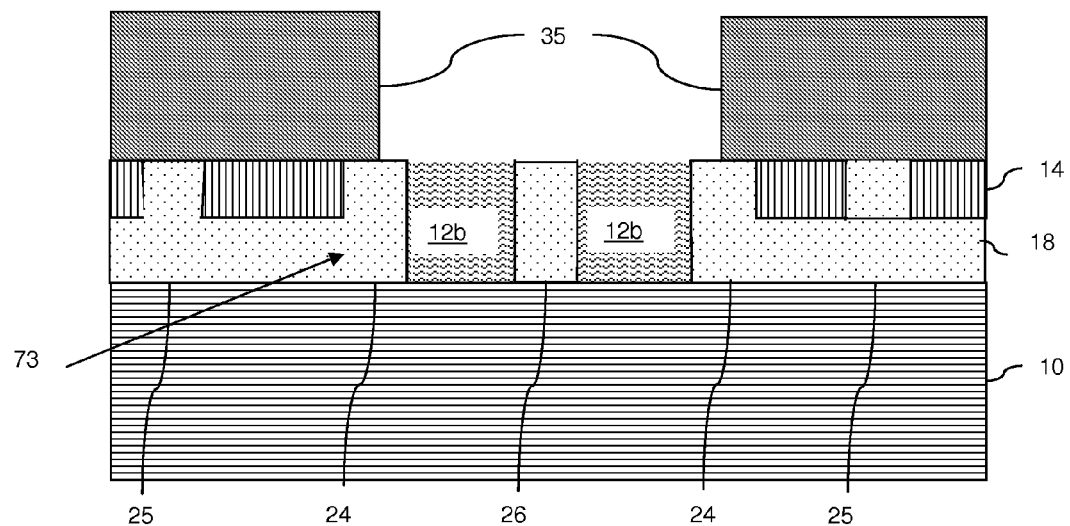

In order to amorphize only the silicon material 12a at process 218, described below, the semiconductor layer 14 must be masked with mask 35 to prevent the semiconductor layer 14 from being simultaneously amorphized (216, see FIG. 12). The mask 35 may be formed by depositing a photoresist layer, lithographically patterning the photoresist layer, and etching the photoresist selective to the silicon material 12a. The silicon material 12a can then be completely amorphized into amorphous silicon material 12b (218, FIG. 12) by implanting the entire thickness of the silicon material 12a in the trench 20 with a species that is capable of breaking down silicon crystals. The species should be one that is also capable of being incorporated into the silicon material when the silicon material recrystallizes (e.g., silicon or germanium). Note, even if silicon material 12a comprises amorphous silicon, performing the amorphization process (218) is still recommended because recrystallization may have occurred to some extent. Thus, amorphizing the silicon material 12a ensures that the amorphous silicon material 12b is in fact fully amorphized.

Figure 13:
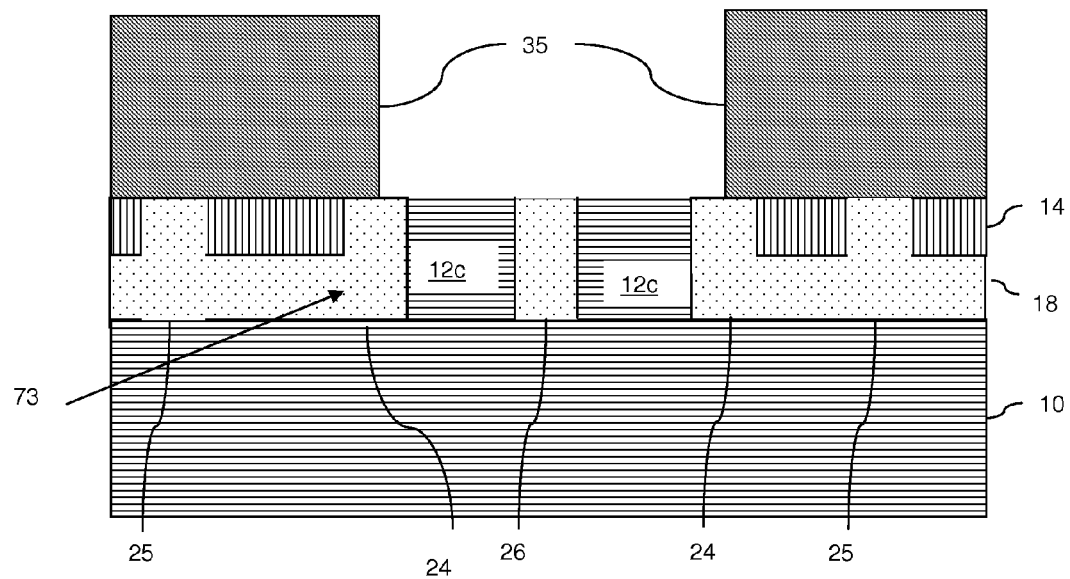

Once the amorphous silicon material 12b is formed at process (218), the mask 35 is removed and the amorphized silicon material 12b is heated above the recrystallization temperature so that it is recrystallized into recrystallized silicon material 12c with the first crystalline orientation of the silicon substrate (219, see FIG. 13). Specifically, the amorphized silicon material 12b that is in contact with the silicon substrate 10 and isolated from the other semiconductor layer 14 by isolation structures 24, is subjected to a recrystallization temperature. This recrystallization temperature causes the crystal structure to replicate up from the silicon substrate 10, thereby, recrystallizing the silicon material in the same orientation (i.e., first crystalline orientation) as silicon substrate 10. The semiconductor layer 14 will remain in the second crystalline orientation because it was not amorphized. An optional polish may be performed at this point to planarize and smooth both orientations of silicon so that a top surface 11 of the semiconductor layer 14 is level with a top surface 13 of the recrystallized silicon material 12c. The resulting structure 1 comprises an area 100, having a first crystalline orientation, on a same plane 2 with an area 200, having a second crystalline orientation, as described in detail above (see FIG. 1).

Figure 14:
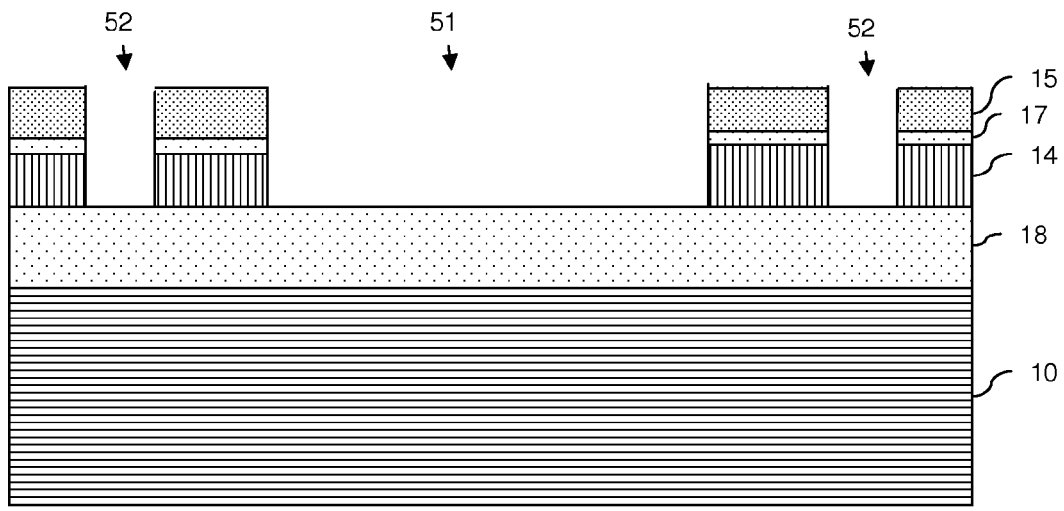
Figure 15:
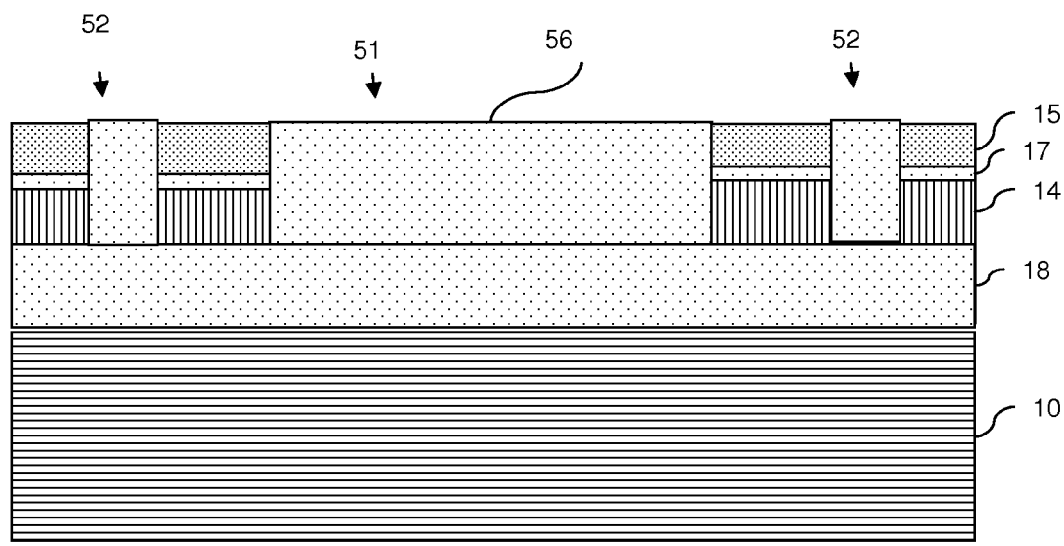

Referring to FIG. 3, in another embodiment of the method, a first trench 51 is patterned on the multi-layer stack 5 in an area where the silicon material 12c having a first crystalline orientation and the isolation structures 24 and 26 are to be formed (see FIG. 1). Other trenches 52 have a width that is smaller than the first trench may also be patterned to form the isolation structures 25 that will separate different device sections (e.g., 200.1 and 200.1) within the second semiconductor area 200. The first trench 51 and other trenches 52 are processed in a manner consistent with shallow trench isolation technology in which the trenches 51, 52 are etched (304), cleaned, filled with an oxide (306) and polished (e.g., by chemical-mechanical polishing). Specifically, the first trench 51 and other trenches 52 are etched through the nitride layer 15, the thin oxide layer 17, the semiconductor layer (304, see FIG. 14). The first trench 51 and other trenches 52 are filled with an oxide 56 (e.g., $SiO_2$) (306, see FIG. 15). The oxide 56 is polished level with the nitride layer 15.

Figure 16:
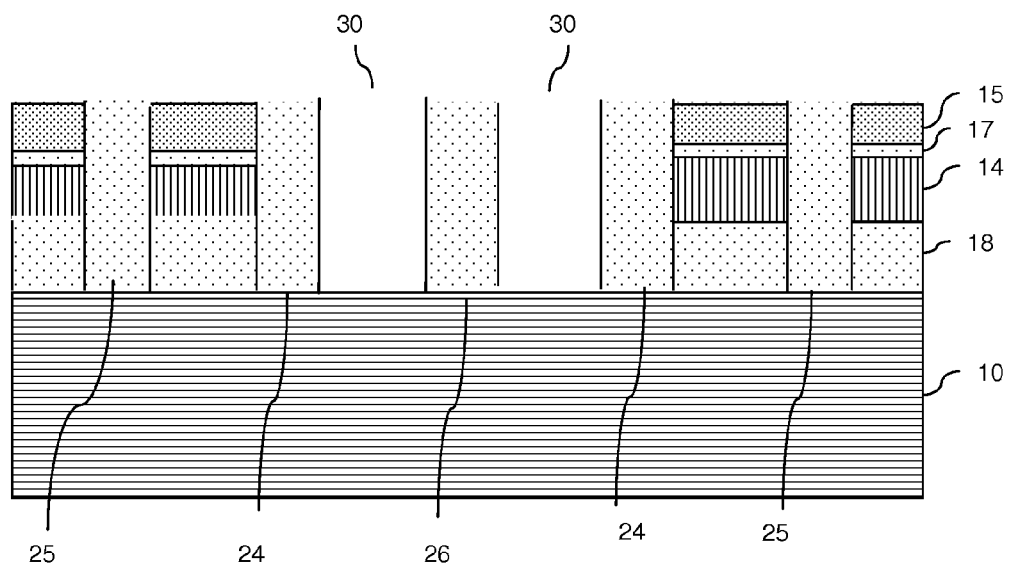
Figure 17:
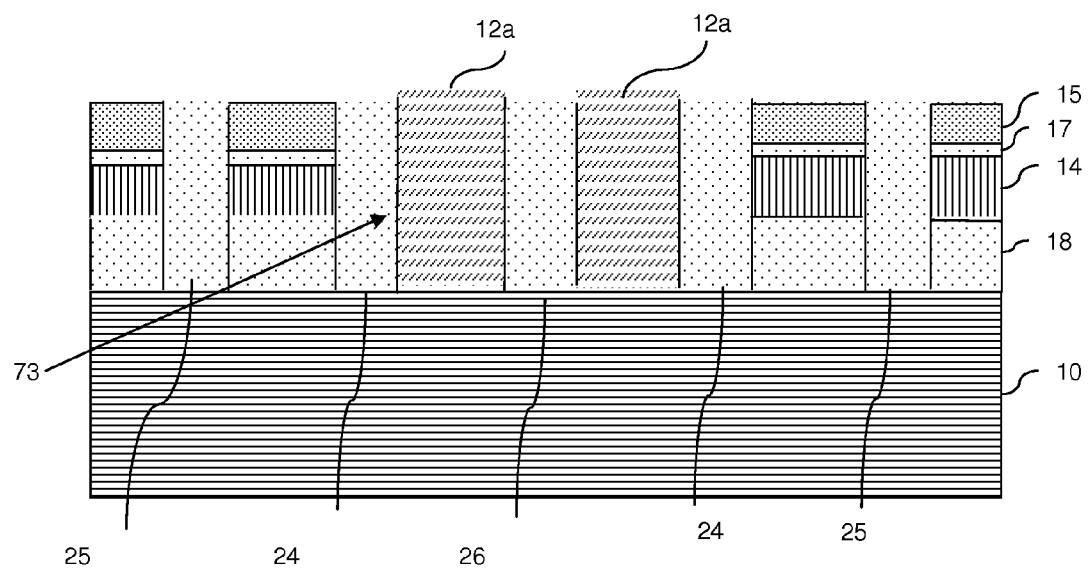

Second trenches 30 are then formed (e.g., lithographically patterned and etched) through the oxide 56 in the first trench 51 down to the silicon substrate 10 (308, see FIG. 16). The second trenches 30 are smaller in dimension than the first trench 51 and are etched so that oxide 56 remains on the sidewalls 73 of the first trench 51 to becomes the isolation structures 24 that will separate the first semiconductor area 100 from the second semiconductor area 200 (see FIG. 1). Additionally, if more than one second trench 30 is formed the remaining oxide 56 between the trenches 30 becomes the isolation structure 26 that separates the different device sections (e.g., 100.1-100.2) of the first semiconductor area 100 (see FIG. 1). The second trenches 30 are filled with a silicon material 12a, such as an amorphous silicon or a polysilicon, which contacts the silicon substrate 10 (310) and any excess silicon material 12a is polished off the nitride layer 15 (312, see FIG. 17). A patterned mask 35 is then applied such that only the silicon material 12a is exposed and the silicon material 12a is amorphized into amorphized silicon material 12b (318, see FIG. 18 and detailed discussion of the amorphization process 218 above). After amorphizing process (318), the mask 35 is removed and the wafer 5 is cleaned.

Figure 18:
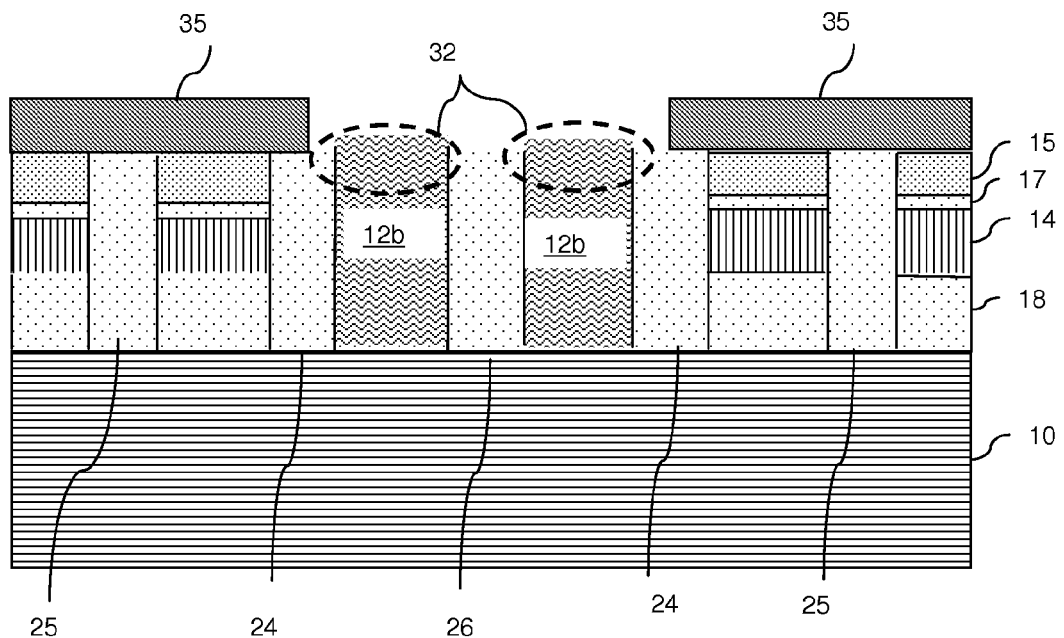
Figure 19:
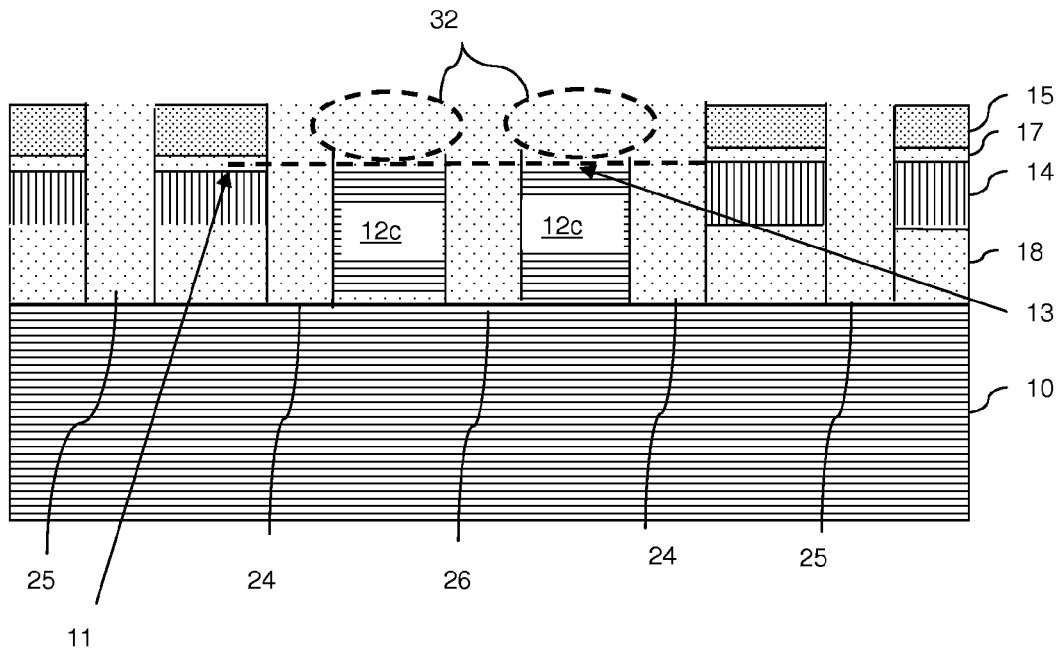

The amorphized silicon material 12b is then recrystallized into material 12c by heating above a recrystallization temperature, as discussed above with regard to the recrystallization process (219) (320 or 322, see FIG. 18). However, in addition to recrystallizing the amorphized silicon material 12b, a top portion 32 of the silicon material should be oxidized to facilitate later processing (319 or 322, see FIG. 18). If the thermal oxidation process includes an oxidation anneal at a temperature greater than the recrystallization temperature, oxidation and recrystallization can be performed simultaneously (322). Alternatively, the thermal oxidation (319) can be performed, followed by a recrystallization anneal (320). The nitride layer 15 of the stack 5 is then stripped and the wafer 5 is polished so that a top surface 11 of the semiconductor layer 14 is level with a top surface 13 of the recrystallized silicon columns 12c (324). The resulting structure 1 comprises an area 100, having a first crystalline orientation, on a same plane 2 with an area 200, having a second crystalline orientation, as described in detail above (see FIG. 1).

An alternative method of forming the dual orientation wafer of FIG. 1 incorporates a process of epitaxially growing silicon from the silicon substrate at the bottom of a trench such that the silicon has the same crystalline orientation as the silicon substrate. Isolation structures could be formed either before or after epitaxially growing the silicon material in a similar manner as described above in order to separate the areas 100, 200 on the wafer having the different crystalline orientations.

Therefore, disclosed is a method of manufacturing dual orientation wafers. A trench is formed in a multi-layer wafer to a silicon substrate with a first crystalline orientation. The trench is filled with a silicon material (e.g., amorphous silicon or polysilicon trench). Isolation structures are formed to isolate the silicon material in the trench from a semiconductor layer with a second crystalline orientation. Additional isolation structures can be formed within the silicon material in the trench and within the semiconductor layer. A patterned amorphization process is performed on the silicon material in the trench followed by a recrystallization anneal such that the silicon material in the trench recrystallizes with the same crystalline orientation as the silicon substrate. The resulting structure is a semiconductor wafer with isolated semiconductor areas on the same plane having different crystalline orientations as well as isolated sections within each semiconductor area for device formation. While the invention has been described in terms of embodiments, those skilled in the art will recognize that the invention can be practiced with modification within the spirit and scope of the appended claims.

What is claimed is:

1. A method of forming a semiconductor structure, said method comprising:
   providing a multi-layer stack comprising a silicon substrate, an insulating layer on said silicon substrate, and a semiconductor layer on said insulating layer, wherein said silicon substrate has a first crystalline orientation and said semiconductor layer has a second crystalline orientation;
   filling a trench in said multi-layer stack with a silicon material such that said silicon material is in contact with said silicon substrate;
   forming isolation structures on sidewalls of said trench,
   amorphizing said silicon material; and
   heating said silicon material such that said silicon material recrystallizes with said first crystalline orientation and said semiconductor layer remains in said second crystalline orientation.

2. The method of claim 1, further comprising forming additional isolation structures within said silicon material in said trench and within said semiconductor layer outside said trench.

3. The method of claim 1, wherein said amorphizing of said silicon material comprises implanting said silicon material with an impurity that is capable of breaking down silicon crystals in said silicon material and is further capable of being incorporated into said silicon material when said silicon material recrystallizes during said heating of said silicon material.

4. The method of claim 1, wherein said amorphizing of said silicon material comprises implanting said silicon material with one of silicon and germanium.

5. The method of claim 1, wherein said semiconductor layer comprises one of silicon layer and a gallium arsenide layer.

6. The method of claim 1, wherein said semiconductor layer comprises a silicon layer having a second crystalline orientation comprising one of a 100, 111, 110, 211, 311, 511 and 711 orientation, and wherein said first crystalline orientation comprises one of a 100, 111, 110, 211, 311, 511 and 711 orientation.

7. A method of forming a semiconductor structure, said method comprising:
   forming a trench in a multi-layer stack through a semiconductor layer and an insulating layer to a silicon substrate, wherein said silicon substrate has a first crystalline orientation and wherein said semiconductor layer has a second crystalline orientation;
   filling said trench with a silicon material, wherein said silicon material comprises one of amorphous silicon and poly-crystalline silicon and wherein said silicon material is in contact with said silicon substrate;
   after said filling of said trench, forming isolation structures on said sidewalls of said trench;
   amorphizing said silicon material; and
   heating said silicon material such that said silicon material recrystallizes with said first crystalline orientation and said semiconductor layer remains in said second crystalline orientation.

8. The method of claim 7, further comprising, after said heating of said silicon material, removing said nitride layer from above said semiconductor layer such that a top surface of said semiconductor layer is planar with said silicon material.

9. The method of claim 7, wherein said semiconductor layer comprises one of a silicon layer and a gallium arsenide layer.

10. The method of claim 7, wherein said semiconductor layer comprises a silicon layer having a second crystalline orientation comprising one of a 100, 111, 110, 211, 311, 511 and 711 orientation, and wherein said first crystalline orientation comprises one of a 100, 111, 110, 211, 311, 511 and 711 orientation.

11. A method of forming a semiconductor structure, said method comprising:
   forming a first trench in a multi-layer stack through a semiconductor layer to an insulating layer;
   filling said first trench with an oxide;
   forming at least one second trench through said oxide in said first trench to said insulating layer, wherein said insulating layer has a first crystalline orientation and said semiconductor layer has a second crystalline orientation;
   filling said at least one second trench with a silicon material, wherein said silicon material comprises one of amorphous silicon and poly-crystalline silicon and wherein said silicon material is in contact with said insulating layer;
   amorphizing said silicon material; and
   heating said silicon material such that said silicon material recrystallizes with said first crystalline orientation and said semiconductor layer remains in said second crystalline orientation.

12. The method of claim 11, further comprising, in addition to said forming of said first trench and said filling of said first trench with an oxide, simultaneously forming at least one other trench through said semiconductor layer and said insulating layer to said silicon substrate and simultaneously filling said second trench with said oxide.

13. The method of claim 11, further comprising, after said heating of said silicon material, removing said nitride layer from above said semiconductor layer such that a top surface of said semiconductor layer is planar with said silicon material.

14. The method of claim 11, wherein said amorphizing of said silicon material comprises implanting said silicon material with an impurity that is capable of breaking down silicon crystals in said silicon material and is further capable of being incorporated into said silicon material when said silicon material recrystallizes during said heating of said silicon material.

15. The method of claim 11, wherein said amorphizing of said silicon material comprises implanting said silicon material with one of silicon and germanium.

16. The method of claim 11, wherein said semiconductor layer comprises one of a silicon layer and a gallium arsenide layer.

17. The method of claim 11, further comprising, after said amorphizing of said silicon material, oxidizing an upper portion of said silicon material adjacent said nitride layer such that a top surface of a lower portion of said silicon material is approximately level with a top surface of said semiconductor layer.

* * * * *